United States Patent
Yokoyama et al.

(10) Patent No.: US 8,014,736 B2
(45) Date of Patent: Sep. 6, 2011

(54) DISTORTION COMPENSATING APPARATUS, WIRELESS COMMUNICATING APPARATUS, AND DISTORTION COMPENSATING METHOD

(75) Inventors: Takashi Yokoyama, Kawasaki (JP); Kouji Hirai, Kawasaki (JP); Shigeru Ohkawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 458 days.

(21) Appl. No.: 12/339,316

(22) Filed: Dec. 19, 2008

(65) Prior Publication Data

US 2009/0298446 A1   Dec. 3, 2009

(30) Foreign Application Priority Data

May 27, 2008   (JP) ................................. 2008-138731

(51) Int. Cl.
   *H04B 1/04*   (2006.01)
(52) U.S. Cl. .................. 455/126; 455/114.1; 455/114.2; 455/114.3; 455/115.1; 330/149; 330/297
(58) Field of Classification Search .... 455/114.1–114.3, 455/115.1, 123–126; 330/149, 297
See application file for complete search history.

(56) References Cited

U.S. PATENT DOCUMENTS

| | | | | |
|---|---|---|---|---|
| 5,903,823 A * | 5/1999 | Moriyama et al. | ............ | 455/126 |
| 6,091,941 A * | 7/2000 | Moriyama et al. | ............ | 455/126 |
| 6,909,756 B1 * | 6/2005 | Nakajima | ............ | 375/296 |
| 7,277,678 B2 * | 10/2007 | Rozenblit et al. | ............ | 455/91 |
| 7,440,731 B2 * | 10/2008 | Staudinger et al. | ............ | 455/91 |
| 7,460,842 B2 * | 12/2008 | Black et al. | ............ | 455/127.1 |
| 7,469,491 B2 * | 12/2008 | McCallister et al. | ............ | 375/296 |
| 7,830,979 B2 * | 11/2010 | Shako et al. | ............ | 375/296 |
| 7,876,156 B2 * | 1/2011 | Tanaka et al. | ............ | 330/285 |
| 7,904,033 B1 * | 3/2011 | Wright et al. | ............ | 455/114.2 |
| 7,917,105 B2 * | 3/2011 | Drogi et al. | ............ | 455/126 |
| 2007/0054635 A1 * | 3/2007 | Black et al. | ............ | 455/127.1 |
| 2007/0241816 A1 * | 10/2007 | Okazaki et al. | ............ | 330/149 |

FOREIGN PATENT DOCUMENTS

| | | |
|---|---|---|
| JP | 10-322137 | 12/1998 |
| JP | 2001-57522 | 2/2001 |
| JP | 2007-28420 | 2/2007 |

* cited by examiner

*Primary Examiner* — Linh Nguyen
(74) *Attorney, Agent, or Firm* — Katten Muchin Rosenman LLP

(57) ABSTRACT

A distortion compensating apparatus includes following units. An information measuring unit measures a distortion component and an electric power component based on a radiation signal. A compensation coefficient calculating unit calculates a compensation coefficient based on the distortion component and the electric power component. A signal transmitting unit outputs a signal corrected by the compensation coefficient as a transmission signal. A signal converting unit converts the transmission signal into a high frequency signal. An amplitude separating unit amplifies the high frequency signal and separates a portion thereof as a signal to be fed back. A feeding-back unit processes the portion and outputs the result as a feedback signal to the information measuring unit. An electric power information extracting unit outputs a portion of the high frequency signal as the radiation signal, extracts electric power information from the radiation signal, and directly outputs the electric power information to the information measuring unit.

12 Claims, 6 Drawing Sheets

DISTORTION COMPENSATING APPARATUS, WIRELESS COMMUNICATING APPARATUS, AND DISTORTION COMPENSATING METHOD

CROSS-REFERENCE TO RELATED APPLICATION

This application is based upon and claims the benefit of priority of the prior Japanese Patent Application No. 2008-138731, file on May 27, 2008, the entire contents of which are incorporated herein by reference.

FIELD

The embodiments discussed herein are directed to a distortion compensating apparatus, a wireless communicating apparatus, and a distortion compensating method that compensate distortion of a transmission signal in wireless communication.

BACKGROUND

Increasing capacity and higher functionality of wireless apparatuses in general are accompanied by further demands for lower power consumption, downsizing, lower costs, and higher stability. Therefore, the wireless apparatus is generally provided with a distortion compensating circuit in a power amplifier.

To obtain the effect of the distortion compensating circuit, it is necessary to enhance the stability of a distortion component and an electric power component. Therefore, a high performance feedback circuit is used in the distortion compensating circuit (see, e.g., Japanese Patent Application Laid-open No. 2001-57522).

A conventional distortion compensating circuit provided with a high performance feedback circuit is described in detail below. FIG. 5 depicts a distortion compensating circuit according to a conventional technique. As depicted in FIG. 5, the distortion compensating circuit includes a signal processing/control unit, a TRF unit (transmission high frequency circuit), a PA unit (high-power amplifying circuit), and a VSWR unit (Voltage Standing Wave Ratio circuit).

The signal processing/control unit produces and outputs a transmission signal (modulated wave). The TRF unit has an FW-MOD (Feedforward-Modulation) that converts the transmission signal output from the signal processing/control unit into an RF signal (high frequency signal) and an FB-CONV (FeedBack-Converter) that is a feedback circuit. The PA unit has a directional coupler (DC) that amplifies the RF signal converted by the TRF unit to a desired value and that separates the RF signal into electric power to be output to an antenna (ANT) not shown and electric power to be feed-back. The VSWR unit has a VSWR (Voltage Standing Wave Ratio) that outputs the electric power amplified by the PA unit to the antenna, and that detects the state of the antenna from the electric power output to the antenna and that outputs the state to the signal processing/control unit.

The distortion compensating circuit having such a configuration outputs the transmission signal from the signal processing/control unit (see (1) of FIG. 5). The distortion compensating circuit separates the output transmission signal into the electric power for the ANT and that for the FB-CONV using the PA unit located at around the final output (see (2) of FIG. 5). The distortion compensating circuit feeds back the signal separated for the FB-CONV to the signal processing/control unit to analyze the electric power and the distortion component of the signal output from the ANT at the location (see (3) of FIG. 5). The signal processing/control unit to which the output signal is fed back analyzes the signal. When the signal component analyzed includes much distortion, the signal processing/control unit determines that the signal component radiated from the ANT includes much distortion. The signal processing/control unit also determines whether the electric power of the signal is high or low. Based on these determination results, the signal processing/control unit executes distortion compensation to correct the distortion component (distortion information) and the amplitude component (electric power information) to the signal to be output to the FW-MOD of the TRF unit, and the signal processing/control unit outputs the compensated signal. The distortion compensation is an ordinary compensation executed by calculating a compensation coefficient using the distortion component and the amplitude component, and using the calculated compensation coefficient. Therefore, the detailed description for the compensation is not provided.

Referring to FIG. 6, the process flow of a distortion compensation according to the above conventional technique is described. FIG. 6 is a flowchart of the distortion compensating process according to the conventional technique. As illustrated in FIG. 6, in the distortion compensating circuit according to the conventional technique: the signal processing/control unit produces a modulated wave (IQ signal) using a compensation coefficient at the current stage and outputs the modulated wave to the TRF unit (Step S201); the FW-MOD of the TRF unit converts the output modulated wave into an RF signal (Step S202) and, thereafter, a PA unit amplifies the RF signal to a desired value (ANT output value) (Step S203).

The distortion compensating circuit radiates the signal amplified by the PA unit from the ANT through the VSWR unit (Steps S204 and S205) and outputs a portion of the signal to an FB-CONV that is a feedback circuit (Step S206). The distortion compensating circuit that feeds back the portion of the output signal to the antenna produces an IF signal (Intermediate Frequency) by executing frequency conversion and power amplification to the signal fed back (Step S207). The distortion compensating circuit executes temperature compensation in the feedback circuit to the produced IF signal to reduce the influence received from the external environmental variation (for example, temperature) (Step S208) and the IF signal is separated into its modulation component and its signal power through an A/D conversion (Analog/Digital conversion) (Step S209).

The distortion compensating circuit that obtains the modulation component and the signal power in this manner measures and compares a distortion component from the obtained modulation component (Step S210), also measures and compares an amplitude component from the obtained signal power (Step S211), and calculates a compensation coefficient from both of the distortion component and the amplitude component (Step S212). Thereafter, the distortion compensating circuit repeats the process of Step S201 and its succeeding steps using the newly calculated compensation coefficient.

However, the above conventional technique has difficulties in feeding back stable information especially on electric power information and, therefore, proper distortion compensation is not executable. Further, the conventional technique has a problem in that, even when stable information on the electric power can be fed back, it takes long to adjust the feedback circuit and, in addition, the feedback circuit becomes complicated and expensive.

More specifically, when distortion compensation is executed, the signal returned from the feedback circuit and the signal information actually radiated from the ANT need to be matched with each other and, to do so, especially the electric power information is required to be fed back at high stability. However, many elements such as a DC-VATT (variable attenuator), DC-MIX (mixer), DC-AMP (amplifier), DC-AEQL (Amplitude Equalizer), DC-DEQL (Delay Equalizer), and DC-AMP are used in the feedback circuit (see FIG. 5), and each of the elements has its own characteristic against the environmental temperature. Particularly, an active element (such as an AMP) receives a stronger influence from the environmental temperature compared to a passive element and its variation rate of the gain per one degree Centigrade [° C.] is generally 0.015 decibel [dB] (for a GaAs FET). Therefore, the distortion compensating circuit according to the conventional technique executes amplitude (electric power) compensation using a TH (gain-temperature compensating circuit). However, there is a limit in properly compensating the amplitude (electric power) for each of the above many elements based on the environmental temperature.

It is conceivable to compensate the amplitude (electric power) for each of the above many elements by using a feedback circuit that includes many THs. However, in this case, the feedback circuit becomes complicated and, because of the need to increase the elements, the circuit becomes expensive. In addition, each TH must be adjusted to compensate the amplitude (electric power) and, the adjustments take tremendous time.

SUMMARY

It is an object of the present invention to at least partially solve the problems in the conventional technology.

According to an aspect of an embodiment, a distortion compensating apparatus includes an information measuring unit that measures a distortion component based on a feedback signal obtained by feeding back a portion of a radiation signal radiated from an antenna, and that also measures an electric power component based on electric power information extracted from the radiation signal radiated from the antenna, a compensation coefficient calculating unit that calculates a compensation coefficient to correct distortion of the signal radiated from the antenna, from the distortion component and the electric power component that are measured by the information measuring unit, a signal transmitting unit that outputs a signal corrected using the compensation coefficient calculated by the compensation coefficient calculating unit as a transmission signal, a signal converting unit that converts the transmission signal transmitted by the signal transmitting unit into a high frequency signal, an amplitude separating unit that amplifies the high frequency signal converted by the signal converting unit, that outputs the amplified high frequency signal, that picks up a portion from the output high frequency signal, and that separates the portion as a signal to be fed back, a feeding-back unit that outputs to the information measuring unit as the feedback signal a signal obtained by executing frequency conversion and digital conversion to the high frequency signal separated by the amplitude separating unit to be fed back, and an electric power information extracting unit that outputs the high frequency signal separated by the amplitude separating unit as the radiation signal to the antenna, that extracts the electric power information from the radiation signal, and that directly outputs the electric power information to the information measuring unit without passing the electric power information through the feeding-back unit.

According to another aspect of an embodiment, a wireless communicating apparatus includes a distortion compensating apparatus. The distortion compensating apparatus includes an information measuring unit that measures a distortion component based on a feedback signal obtained by feeding back a portion of a radiation signal radiated from an antenna, and that also measures an electric power component based on electric power information extracted from the radiation signal radiated from the antenna, a compensation coefficient calculating unit that calculates a compensation coefficient to correct distortion of the signal radiated from the antenna, from the distortion component and the electric power component that are measured by the information measuring unit, a signal transmitting unit that outputs a signal corrected using the compensation coefficient calculated by the compensation coefficient calculating unit as a transmission signal, a signal converting unit that converts the transmission signal transmitted by the signal transmitting unit into a high frequency signal, an amplitude separating unit that amplifies the high frequency signal converted by the signal converting unit, that outputs the amplified high frequency signal, that picks up a portion from the output high frequency signal, and that separates the portion as a signal to be fed back, a feeding-back unit that outputs to the information measuring unit as the feedback signal a signal obtained by executing frequency conversion and digital conversion to the high frequency signal separated by the amplitude separating unit to be fed back, and an electric power information extracting unit that outputs the high frequency signal separated by the amplitude separating unit as the radiation signal to the antenna, that extracts the electric power information from the radiation signal, and that directly outputs the electric power information to the information measuring unit without passing the electric power information through the feeding-back unit.

According to still another aspect of an embodiment, a method of compensating distortion includes measuring, using an information measuring unit, a distortion component based on a feedback signal obtained by feeding back a portion of a radiation signal radiated from an antenna, and also measuring an electric power component based on electric power information extracted from the radiation signal radiated from the antenna, calculating a compensation coefficient to correct distortion of the signal radiated from the antenna, from the distortion component and the electric power component that are measured in the measuring, transmitting a signal corrected using the compensation coefficient calculated in the calculating as a transmission signal, converting the transmission signal transmitted in the transmitting into a high frequency signal, amplifying the high frequency signal converted in the converting to output the amplified high frequency signal, and picking up a portion from the output high frequency signal to separate the portion as a signal to be fed back, operating a feeding-back unit that outputs to the information measuring unit as the feedback signal a signal obtained by executing frequency conversion and digital conversion to the high frequency signal to be fed back separated in the amplifying, and outputting the high frequency signal separated in the amplifying as the radiation signal to the antenna, extracting the electric power information from the radiation signal, and directly outputting the electric power information to the information measuring unit without passing the electric power information through the feeding-back unit.

Additional objects and advantages of the invention will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF EMBODIMENTS

Referring to the accompanying drawings, exemplary embodiments of a distortion compensating apparatus, a wireless communicating apparatus, and a distortion compensating method according to the present invention will be described in detail. Firstly, the overview of the distortion compensating apparatus according to the embodiment is described. Secondly, the configuration of the distortion compensating apparatus, and thirdly, the processes performed by the distortion compensating apparatus will be described. In the end, various variations to the embodiments will be described.

[a] First Embodiment

Figure 1:
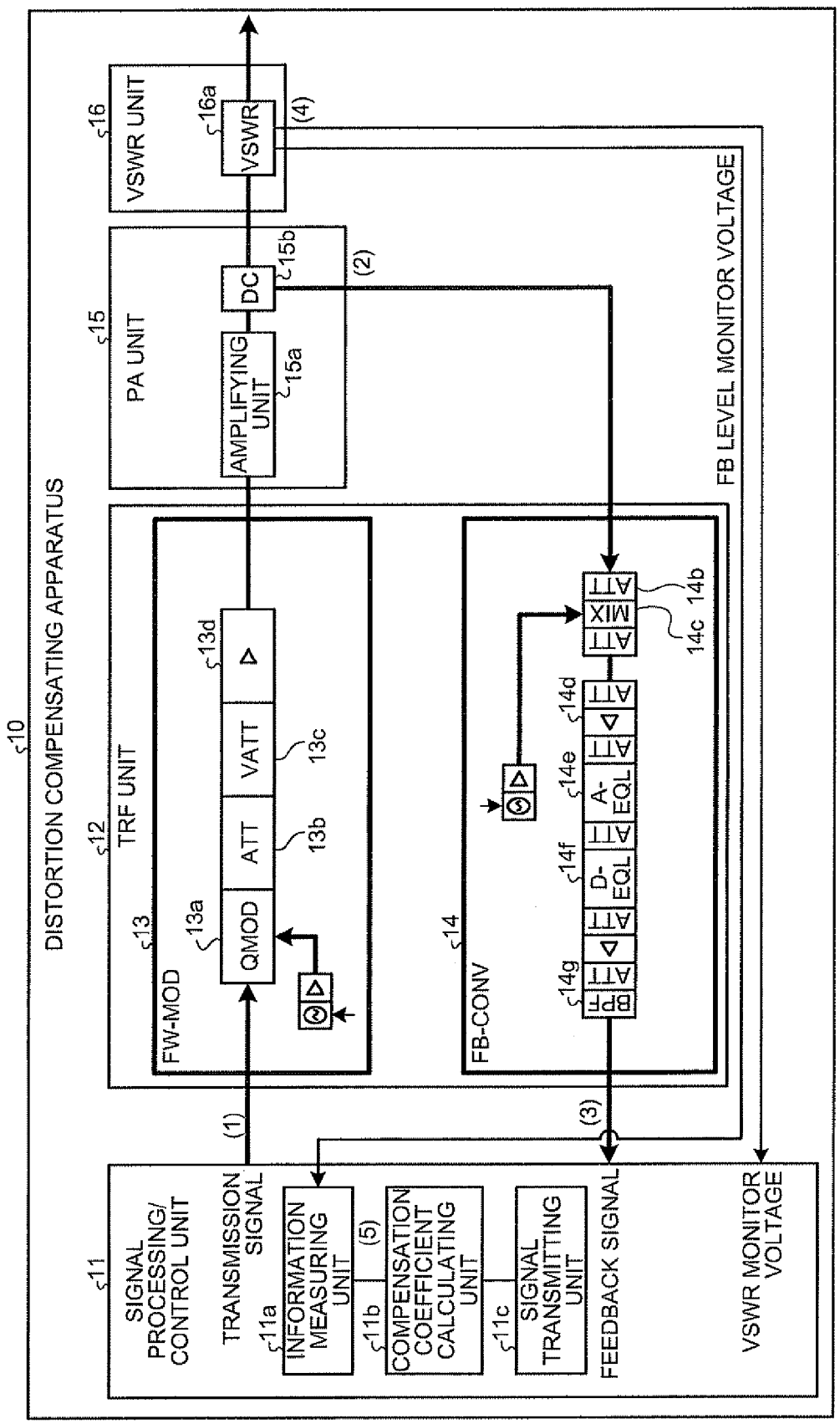
FIG. 1 is a block diagram of a distortion compensating apparatus according to a first embodiment.

Referring to FIG. 1, the overview and the features of the distortion compensating apparatus according to a first embodiment will be described. FIG. 1 is a block diagram of the distortion compensating apparatus according to the first embodiment.

The distortion compensating apparatus depicted in FIG. 1 is an amplifier that is used in a wireless communicating apparatus such as a portable phone. The distortion compensating apparatus depicted in FIG. 1 is a power amplifier that is efficient, that has high linearity, and that is able to collectively amplify many signal channels. Specifically, in this wireless communicating apparatus, when distortion occurs to a transmission signal, the distortion component constitutes leak power to an adjacent channel and, therefore, causes a disturbance to the communication on the adjacent channel. Therefore, the wireless communicating apparatus: incorporates the distortion compensating apparatus; thereby, converts the transmission signal into a high frequency signal; thereafter, amplifies the high frequency signal; feeds back a portion of the amplified signal; extracts a distortion component from the signal obtained by feeding back; removes the distortion component from a transmission signal to be transmitted next (distortion compensation); and transmits the signal to be transmitted next. For example, the wireless communicating apparatus calculates a compensation coefficient from the signal obtained by feeding back, multiplies the transmission signal to be transmitted next by the calculated compensation coefficient (synthesis), thereby, removes the distortion component and the electric power component from the transmission signal (distortion compensation), and transmits the transmission signal to be transmitted next.

In brief, the distortion compensating apparatus according to the first embodiment can remove the distortion component from the transmission signal to be transmitted. In particular, the distortion compensating apparatus can execute correct distortion compensation by a simple adjustment.

More specifically, the distortion compensating apparatus includes a signal processing/control unit that produces and outputs a transmission signal (modulated wave), and a TRF unit that has an FW-MOD that converts the transmission signal output from the signal processing/control unit into an RF signal (high frequency signal) and an FB-CONV that is a feedback circuit. The distortion compensating apparatus further includes a PA unit having a directional coupler (DC) that amplifies the RF signal converted by the TRF unit to a desired value and that separates the RF signal into electric power to be output to an antenna (ANT) and electric power to be fed back, and a VSWR unit that outputs the electric power amplified by the PA unit to the antenna not shown, and that detects the state of the antenna from the electric power output to the antenna and that outputs the state to the signal processing/control unit.

The distortion compensating apparatus having such a configuration outputs from the signal processing/control unit to the TRF unit a signal corrected using the compensation coefficient calculated at the current geographical point (see (1) of FIG. 1). More specifically, the distortion compensating apparatus executes, in the signal processing/control unit, the distortion compensation by multiplying the transmission signal to be transmitted by the compensation coefficient (R1) calculated at the current geographical point, and the apparatus outputs to the TRF unit the transmission signal obtained as the result of the execution of the distortion compensation.

After converting the transmission signal transmitted into a high frequency signal, the distortion compensating apparatus amplifies the converted high frequency signal and separates the amplified high frequency signal into a signal to be radiated from an antenna and a signal to be fed back (see (2) of FIG. 1). More specifically, the distortion compensating apparatus converts, in the FW-MOD of the TRF unit, the transmission signal output from the signal processing/control unit into an RF signal (the high frequency signal) and the apparatus, in the PA unit, amplifies the RF signal converted by the TRF unit to a desired value and separates the amplified signal into electric power to be output to the antenna (ANT) and electric power to be fed back.

The distortion compensating apparatus outputs, to the signal processing/control unit as a feedback signal, a signal obtained by executing frequency conversion and analog/digital conversion to the separated signal to be fed back (see (3) of FIG. 1). More specifically, in the distortion compensating apparatus, the FB-CONV of the TRF unit produces an IF signal by executing frequency conversion and analog/digital conversion to the signal to be fed back that is separated by the PA unit, and the FB-CONV outputs the produced IF signal to the signal processing/control unit as the feedback signal. In this case, to reduce the influence that the FB-CONV receives from the external environmental variation (for example, temperature), temperature compensation may be executed within the feedback circuit.

On the other hand, the distortion compensating apparatus outputs to the antenna the separated signal to be radiated from the antenna, and the distortion compensating apparatus extracts electric power information from the signal to be radiated from the antenna and directly outputs the extracted information to the signal processing/control unit without passing the information through the feedback circuit (see (4)

of FIG. 1). More specifically, in the distortion compensating apparatus, the VSWR unit outputs to the antenna the signal to be radiated from the antenna that is separated by the PA unit, extracts electric information (voltage) from the signal to be radiated from the antenna, and directly outputs the information to the signal processing/control unit without passing the information through the FB-CONV of the TRF unit.

The distortion compensating apparatus measures the distortion component based on a feedback signal obtained by feeding back a potion of the signal radiated from the antenna. The distortion compensating apparatus further measures the electric power component based on the electric power information extracted from the signal radiated from the antenna (see (5) of FIG. 1). More specifically, in the distortion compensating apparatus, the signal processing/control unit measures the distortion component based on the feedback signal fed back by the FW-MOD of the TRF unit, and the signal processing/control unit also measures the electric power component based on the electric power information extracted from the signal radiated from the antenna by the VSWR unit. The distortion compensating apparatus compares the transmission signal to be transmitted with the measured distortion component and electric power component, calculates a new compensation coefficient (R2) to correct the distortion of the radiated signal, executes distortion compensation using the calculated compensation coefficient (R2) to the transmission signal to be transmitted next, and transmits the transmission signal.

In this manner, the distortion compensating apparatus according to the first embodiment enables direct feeding back of the electric power information used to calculate the compensation coefficients from the VSWR unit without passing the information through the FW-MOD of the TRF unit that includes many elements, whose temperature adjustment, etc., is complicated, and, therefore, whose stability is difficult to be maintained at a high level. As a result, the distortion compensating apparatus enables execution of correct distortion compensation by simple adjustments.

Figure 2:
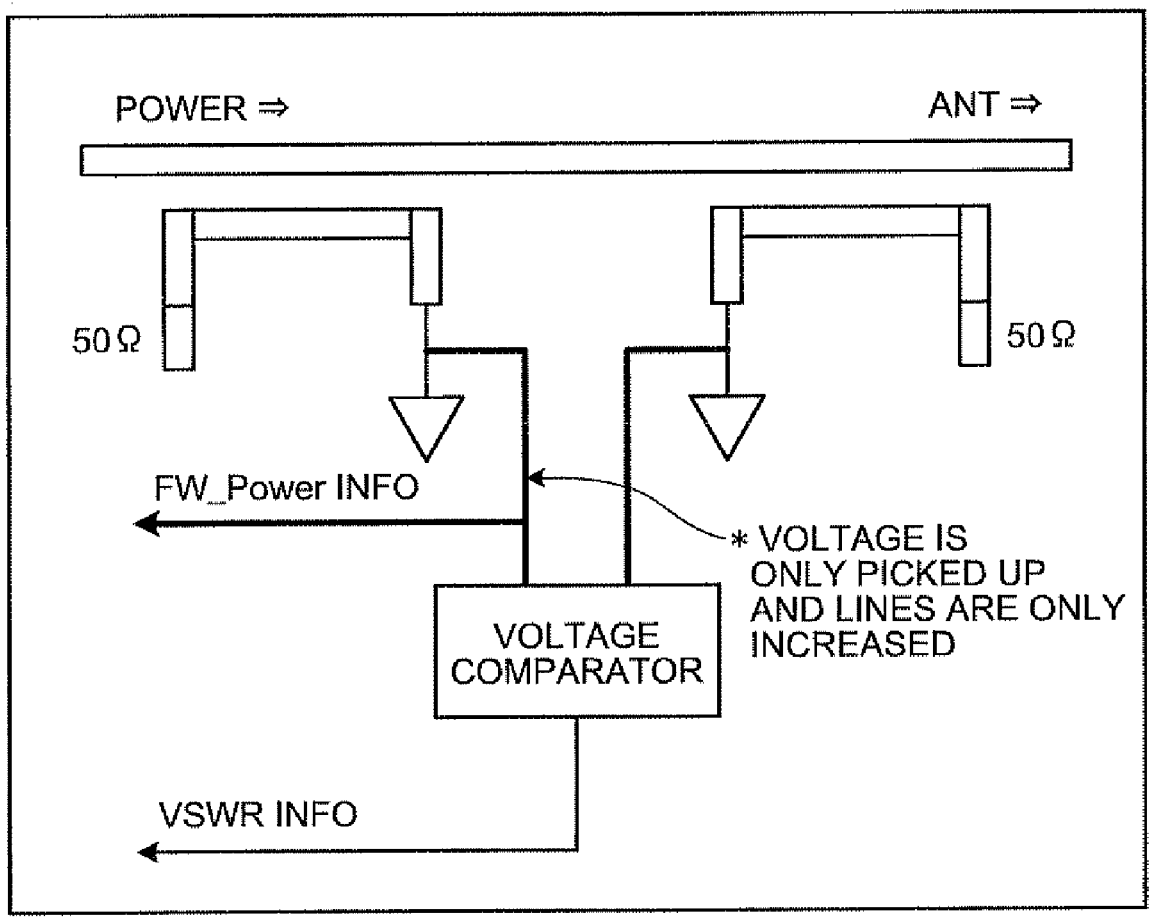
FIG. 2 is a diagram of the detailed configuration of a VSWR in the distortion compensating apparatus according to the first embodiment.
Figure 3:
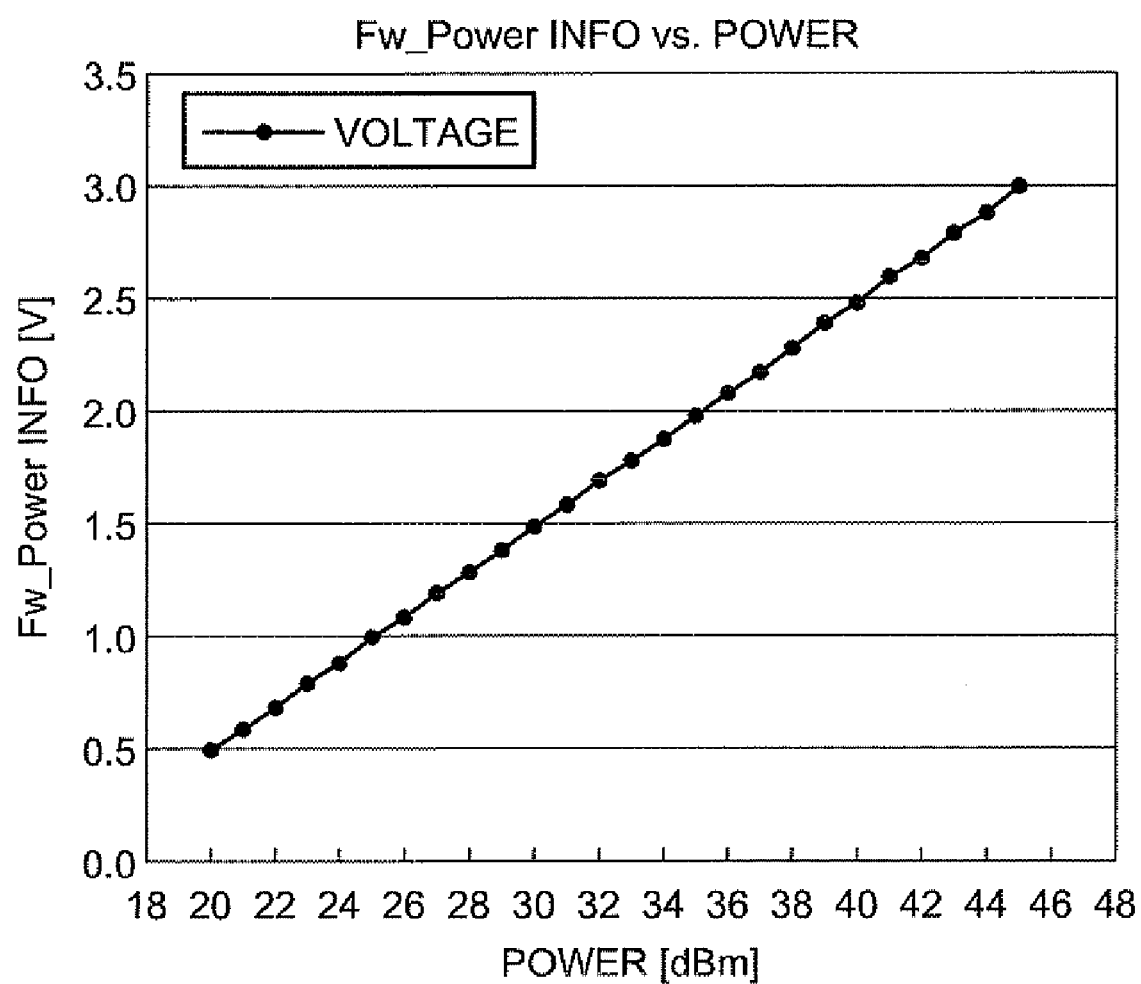
FIG. 3 is a graph of voltage output from the VSWR.

Referring to FIGS. 1 to 3, the configuration of the distortion compensating apparatus will be described. FIG. 2 depicts the detailed configuration of the VSWR unit in the distortion compensating apparatus according to the first embodiment. FIG. 3 depicts the voltage output from the VSWR. As depicted in FIG. 1, a distortion compensating apparatus 10 according to the first embodiment includes a signal processing/control unit 11, a TRF unit 12, a PA unit 15, and a VSWR unit 16.

The signal processing/control unit 11 is a control unit that is connected to the TRF unit 12 and the VSWR unit 16, and produces and outputs a transmission signal (modulated wave), and the signal processing/control unit 11 includes an information measuring unit 11a, a compensation coefficient calculating unit 11b, and a signal transmitting unit 11c as components that are particularly relevant to the present invention.

The information measuring unit 11a measures the distortion component based on the feedback signal obtained by feeding back the portion of the signal radiated from the antenna, and also measures the electric power component based on the electric power information extracted from the signal radiated from the antenna. More specifically, the information measuring unit 11a measures with what signal (distortion) component the signal actually transmitted is transmitted, using the gain variations of the transmission signal actually transmitted and the feedback signal fed back, based on the feedback signal fed back by the FW-MOD 13 of the TRF unit 12 described later. The information measuring unit 11a measures the electric power component indicative of by how large power the signal is actually transmitted, using the difference, etc., in the amplitude between the transmission signal actually transmitted and the electric power information fed back, based on the electric power information extracted from the signal radiated from the antenna by the VSWR unit 16. A measurement technique employed here is a generally known technique, and the detailed description thereof is not provided.

The compensation coefficient calculating unit 11b calculates the compensation coefficient to correct the distortion of the radiated signal from the distortion component and the electric power component calculated by the information measuring unit 11a. More specifically, the compensation coefficient calculating unit 11b calculates the compensation coefficient to correct the distortion of the radiated signal, from the distortion component and the electric power component calculated by the information measuring unit 11a, using a method such as the method of least squares (MLS) or the method of exponentially weighted sequential least squares (RLS).

The signal transmitting unit 11c outputs the signal corrected using the compensation coefficient calculated by the compensation coefficient calculating unit 11b. More specifically, the signal transmitting unit 11c outputs the transmission signal obtained by correcting the distortion component and the electric power component of each of the signals transmitted by the immediately previous transmission, to the FW-MOD 13 of the TRF unit 12 that is connected to the signal transmitting unit 11c, using the compensation coefficient calculated by the compensation coefficient calculating unit 11b.

The TRF unit 12 includes the FW-MOD 13 that converts the transmission signal transmitted by the signal transmitting unit 11c into the high frequency signal, and an FB-CONV 14 that outputs, to the information measuring unit 11a as the feedback signal, the signal obtained by executing the frequency conversion and the analog/digital conversion to the signal to be fed back that is separated by the PA unit 15 described later.

The FW-MOD 13 includes a plurality of elements that convert the transmission signal transmitted by the signal transmitting unit 11c into the high frequency signal and that outputs the high frequency signal to the PA unit 15 described later. The elements that may be included in the FW-MOD 13 are a QMOD 13a, an ATT 13b, a VATT 13c, an amplifier 13d, an ISO, etc.

The QMOD 13a is an orthogonal modulator that multiplies each of two carrier waves each having a phase that differs from that of each other by 90 degrees, by two modulation signals I and Q and, thereafter, that couples the carrier waves with each other. Taking a specific example, the QMOD 13a multiplies a base-band signal transmitted by the signal transmitting unit 11c by a reference frequency signal output by a transmitter not shown and amplified by the amplifier and, thereafter, the QMOD 13a couples these signals with each other to produce the modulated wave that is the high frequency signal.

The ATT 13b is an attenuator that attenuates by a fixed attenuation amount the modulated wave input into this element preventing the impedance matching from being degraded.

The VATT 13c is a variable attenuator that is able to vary its attenuation amount to attenuate. Taking a specific example, the VATT 13c is able to attenuate the high frequency signal produced by the QMOD 13a that is attenuated by the ATT 13b, etc., varying a desired attenuation amount by bias control, etc.

The amplifier 13d is a (voltage amplifying/current amplifying/electric-power amplifying) electronic circuit that enhances the voltage, the current, or the electric power of an input signal and that outputs the enhanced signal. Taking a specific example, the amplifier 13d executes electric power amplification to the high frequency signal produced by the QMOD 13a and attenuated by the VATT 13c, the ATT 13b, etc.

The FB-CONV 14 is a feedback circuit, having a plurality of elements, that outputs to the information measuring unit 11a as the feedback signal the signal obtained by executing the frequency conversion and the analog/digital conversion to the signal separated by the PA unit 15 described later. The elements that may be included in the FB-CONV 14 are a DIV, an ATT 14b, a MIX 14c, an amplifier 14d, an A-EQL 14e, a D-EQL 14f, a BPF 14g, etc.

Of the above elements, the ATT 14b and the amplifier 14d have the same basic functions as those respectively of the above ATT 13b and the amplifier 13d and, therefore, the description thereof is not repeated. The MIX 14c, the A-EQL 14e, the D-EQL 14f, and the BPF 14g that are used in the FB-CONV 14 will be described below.

The MIX 14c frequency-converts the transmission signal output from a DC 15b of the PA unit 15, using the reference frequency signal that is output from a transmitter not shown and that is amplified by the amplifier and, thereby, the transmission signal is converted into an intermediate frequency signal.

The A-EQL 14e is an amplitude equalizer that recovers the amplitude deviation degraded in a path on the way to that of the original transmission signal. More specifically, because the transmission signal output from the DC 15b of the PA unit 15 is degraded on the path on the way, the A-EQL 14e recovers the transmission signal by adjusting to the original transmission signal.

The D-EQL 14f is a delay equalizer that executes delay compensation to a signal being input. Similarly to the A-EQL 14e, the D-EQL 14f adjusts the delay deviation degraded in the path on the way.

The BPF 14g is a band-pass filter that passes only a signal at a frequency in a predetermined frequency range and that attenuates a signal at a frequency in a range other than the predetermined frequency range. Taking a specific example, the BPF 14g passes only the frequency in the predetermined frequency range as the feedback signal from the signal obtained by each of the elements of the above FB-CONV 14, to the information measuring unit 11a.

The PA unit 15 includes an amplifying unit 15a and the DC 15b. The PA unit 15 amplifies the high frequency signal converted by the FW-MOD 13, outputs the amplified high frequency signal to the antenna, picks up a portion from the signal output to the antenna, and separates the portion as a signal to be fed back.

The amplifying unit 15a includes a plurality of amplifiers, amplifies the high frequency signal output from the FW-MOD 13, and outputs the high frequency signal to the DC 15b described later.

The DC 15b is a directional coupler that picks up a portion of a wave traveling in one direction along a main transmission line (a thick line), that shifts the portion to a sub transmission line, and that causes the portion to travel in a specific direction. More specifically, the DC 15b picks up the portion from the signal output to the antenna (ANT) and outputs the picked-up portion of the signal to the FB-CONV 14.

A VSWR 16a is an apparatus that measures the voltage standing wave ratio that is indicative of how efficiently the wireless frequency electric power is transmitted to the antenna through a transmission line. Taking a specific example, as depicted in FIG. 2, similarly to the conventional technique, the VSWR 16a extracts the electric power information (voltage) of the transmission signal output from the VSWR unit 16 using a wave detector included in the VSWR 16a itself, compares the extracted electric power information with the electric power information of the signal reflected by the antenna using a voltage comparator, and outputs the result of the comparison to the signal processing/control unit 11 as a VSWR monitor voltage.

On the other hand, the VSWR 16a extracts the electric power information (voltage) of the transmission signal output from the VSWR unit 16 using the wave detector included in the VSWR 16a itself, and directly outputs the extracted electric power information to the information measuring unit 11a without passing the extracted electric power information through the voltage comparator and the FB-CONV 14. In this case, it can be seen that the electric power information (voltage) of the transmission signal output from the VSWR unit 16 by the wave detector is very stable information as depicted in FIG. 3.

Figure 4:
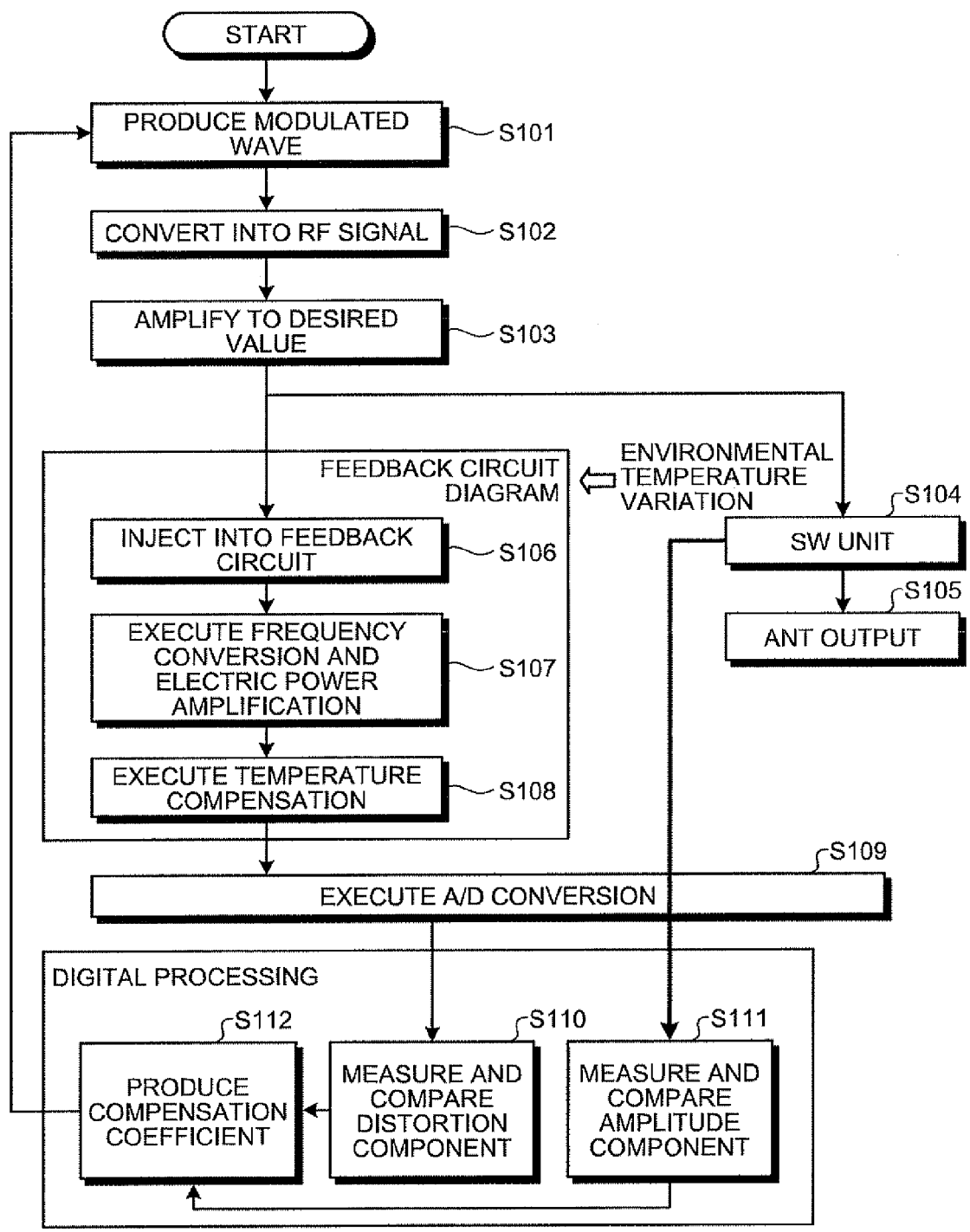
FIG. 4 is a flowchart of process steps in the distortion compensating apparatus according to the first embodiment.
Figure 5:
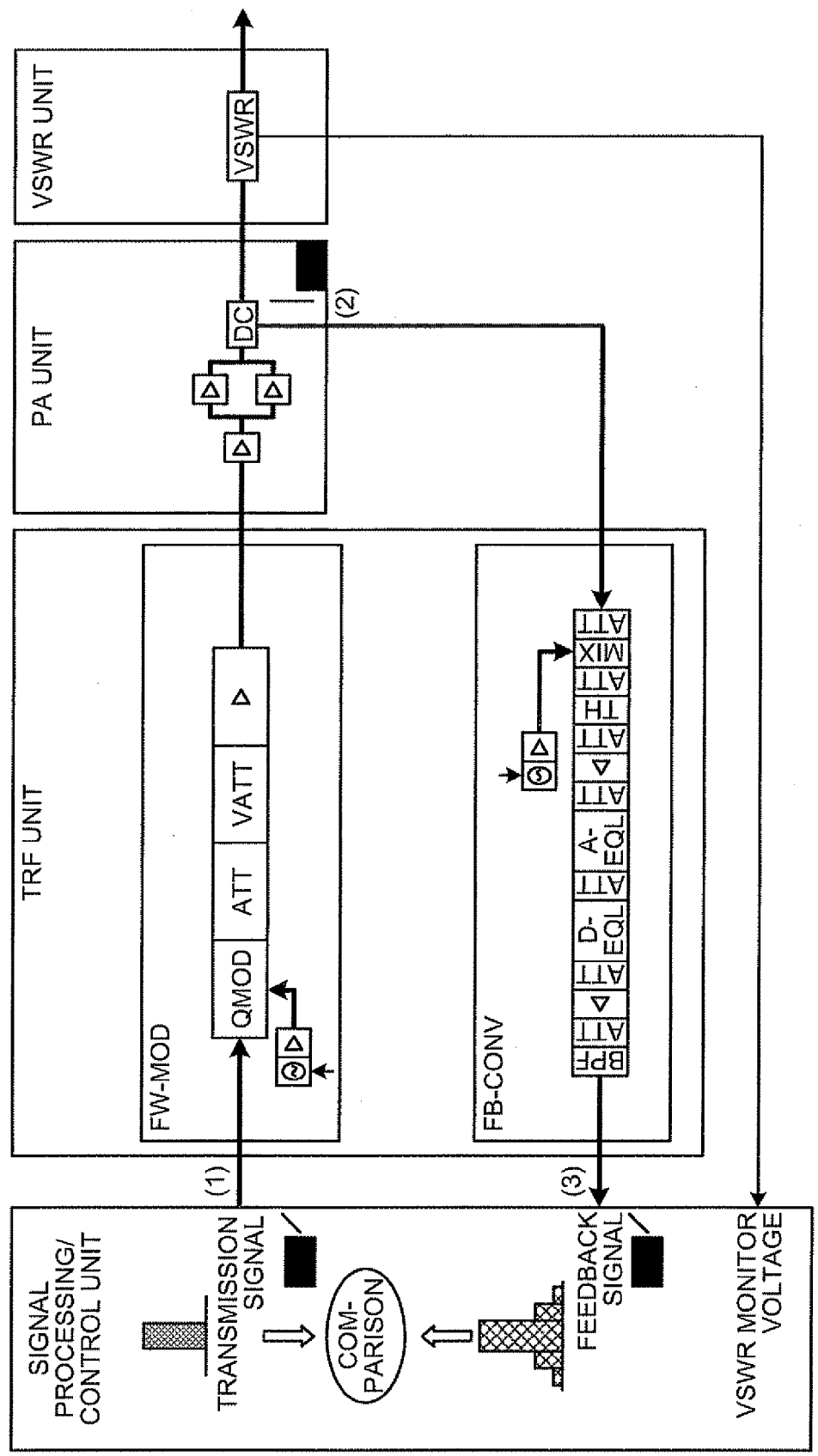
FIG. 5 is a diagram of a distortion compensating circuit according to a conventional technique.
Figure 6:
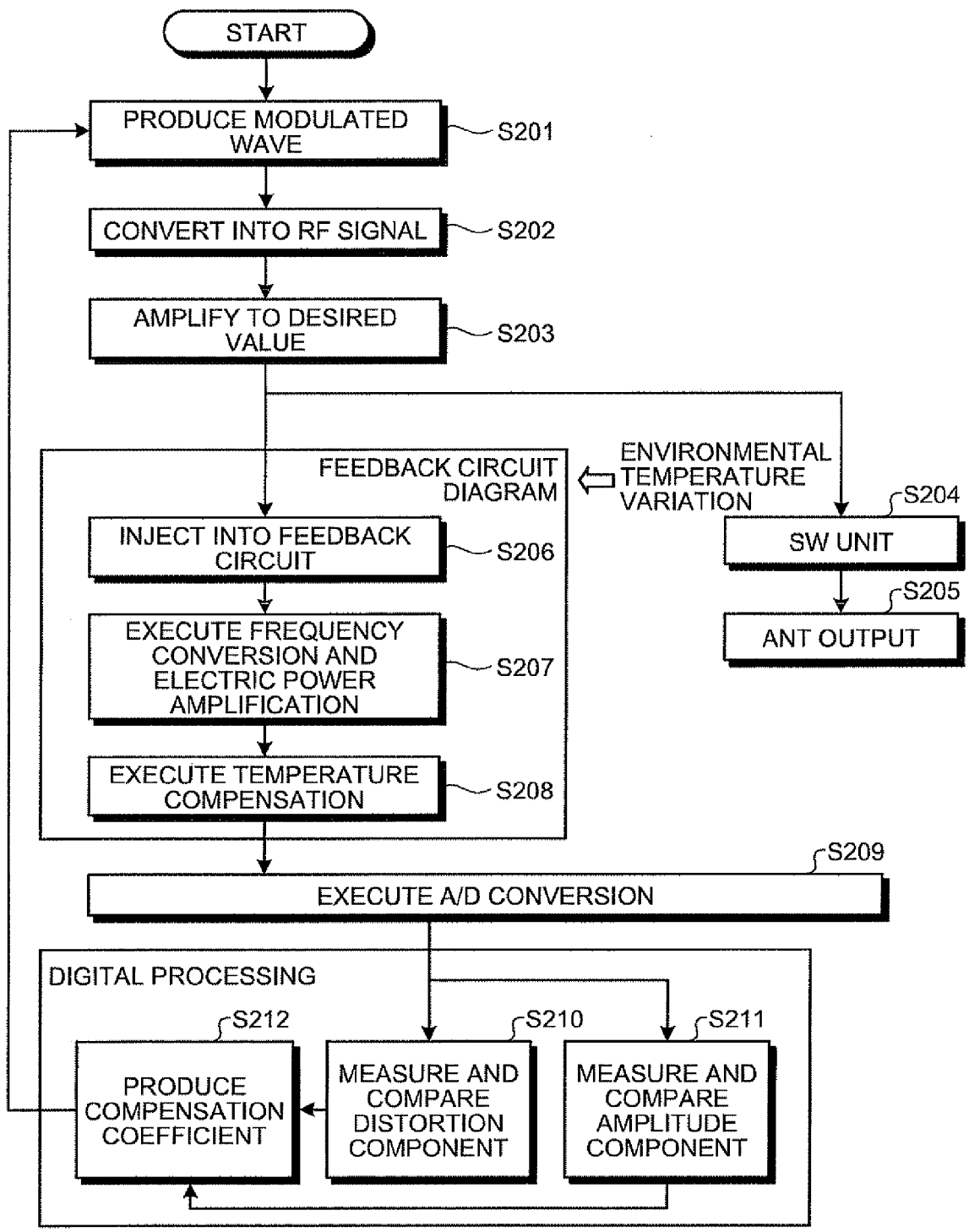
FIG. 6 is a flowchart of a distortion compensating process according to the conventional technique.

Referring to FIG. 4, the process steps by the distortion compensating apparatus will be described. FIG. 4 is a flowchart of the process steps in the distortion compensating apparatus according to the first embodiment.

As depicted in FIG. 4, the distortion compensating apparatus 10 produces the modulated wave (IQ signal) using the compensation coefficient at the current geographic point and outputs the wave to the TRF unit 12 (Step S101), converts the output modulated wave into the RF signal using the FW-MOD 13 of the TRF unit 12 (Step S102), and, thereafter, amplifies the RF signal to a desired value (ANT output value) using the PA unit 15 (Step S103).

The distortion compensating apparatus 10 radiates the signal amplified by the PA unit 15 from the ANT through the VSWR unit 16, and the VSWR unit 16 directly outputs the electric power information detected by the VSWR 16a to the information measuring unit 11a (Steps S104 and S105).

The distortion compensating apparatus 10 outputs the portion of the signal amplified by the PA unit 15 to the FB-CONV 14 that is the feedback circuit (Step S106). The distortion compensating apparatus 10 that feeds back the portion of the output signal to the antenna produces the IF signal (Intermediate Frequency) by executing frequency conversion and power amplification to the signal (Step S107).

The distortion compensating apparatus 10 executes temperature compensation to the produced IF signal in the feedback circuit to reduce the influence received from the external environmental variation (for example, temperature) (Step S108) and extracts the modulation component through the A/D conversion (Step S109). However, the temperature compensation described above is not necessarily needed.

The distortion compensating apparatus 10 that obtains the modulation component in this manner measures and compares the distortion component from the obtained modulation component (Step S110). On the other hand, the distortion compensating apparatus 10 measures and compares the amplitude component from the electric power information obtained from the VSWR unit 16 (Step S111). The distortion compensating apparatus 10 calculates the compensation coefficient from both of the distortion component and the amplitude component (Step S112). Thereafter, the distortion compensating apparatus 10 repeats the process of Step S101 and its succeeding steps using the newly calculated compensation coefficient.

According to the first embodiment, the distortion compensating apparatus 10: measures the distortion component based on the feedback signal obtained by feeding back the portion of the radiation signal radiated from the antenna; also measures the electric power component based on the electric power information extracted from the radiation signal radiated from the antenna; calculates the compensation coefficient to correct the distortion of the signal radiated from the antenna, from the measured distortion component and the measured electric power component; outputs the signal corrected using the calculated compensation coefficient as the transmission signal; converts the transmission signal transmitted into the high frequency signal; amplifies the converted high frequency signal; outputs the amplified high frequency signal; picks up the portion from the output high frequency signal and separates the portion as the signal to be fed back; outputs as the feedback signal the signal obtained by executing the frequency conversion, analog conversion, and digital conversion to the separated high frequency signal to be fed back; outputs the separated high frequency signal as the radiation signal to the antenna; extracts the electric power information from the radiation signal; and directly outputs the electric power information without passing the information through the FB-CONV 14. Therefore, the distortion compensating apparatus 10 enables execution of correct distortion compensation by simple adjustments.

More specifically, the distortion compensating apparatus 10 is able to measure the electric power information with the configuration including only the passive elements without using any active elements that receive strong influence from the environmental temperature. The distortion compensating apparatus 10 is also able to measure the electric power information without passing the information through a plurality of elements that tend to receive influence from the environmental temperature and that each have different individual characteristic. As a result, the distortion compensating apparatus 10 enables execution of correct distortion compensation by simple adjustments.

According to the first embodiment, the distortion compensating apparatus 10 outputs the high frequency signal separated by the PA unit 15 to the antenna as the radiation signal using the VSWR 16a that measures the voltage standing wave ratio, extracts the electric power information from the radiation signal, and directly outputs the information without passing the information through the FB-CONV 14. Therefore, by adding only the path that directly connects the VSWR 16a and the information measuring unit 11a, the distortion compensating apparatus 10 enables execution of correct distortion compensation by simple adjustments without needing complicated change of the circuit configuration.

[b] Second Embodiment

Though the embodiment of the present invention has been described, the present invention may be practiced in various different forms other than the above embodiment. Therefore, different embodiments will be described below classifying the embodiments respectively into [b-1] substitution of the VSWR, [b-2] the temperature adjusting circuit, [b-3] the system configuration, etc.

[b-1] Substitution of VSWR

For example, in the first embodiment, the electric power information of the signal radiated from the antenna is output to the information measuring unit 11a using the VSWR 16a. However, the present invention is not limited to this and a coupler may be used instead of the VSWR 16a. As a result, the apparatus (circuit) is able to be configured at a lower cost.

[b-2] Temperature Adjusting Circuit

Similarly to a conventional distortion compensating apparatus, the distortion compensating apparatus of the present invention may also include a temperature adjusting circuit (TH) in the FB-CONV 14 that is the feedback circuit. In this case, the distortion component is measured from the signal fed back from the FB-CONV 14 and the electric power component is measured from the information output from the VSWR 16a as above. As a result, operations are not necessary such as removal of a temperature adjusting circuit from the circuit configuration used in the conventional technique and, therefore, the distortion compensating apparatus 10 enables execution of simple and correct distortion compensation.

[b-3] System Configuration

Each component of each apparatus illustrated in the drawings is functionally schematic and does not necessarily be configured physically as illustrated. That is, the specific form of distribution and consolidation of each apparatus is not limited to that illustrated, and the whole or part of the form may be configured being functionally or physically distributed and consolidated in arbitrary units. In addition, the whole or arbitrary part of each processing function executed in each apparatus is able to be realized by a CPU and a program analyzed and executed on the CPU, or able to be realized as hardware by wired logics.

Of the process steps described in the embodiment, the whole or part of the process steps that are described as those automatically executed is able to be manually executed. Otherwise, the whole or part of the process steps that are described as those manually executed is able to be automatically executed in a known method. In addition, the process procedures, the control procedures, the specific names, and the information including various data and parameters that are illustrated in the above description and drawings may be arbitrarily changed except the case where especially specified.

As can be seen from the foregoing, the embodiments of the present invention enable execution of correct distortion compensation by a simple adjustment.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A distortion compensating apparatus comprising:
   an information measuring unit that measures a distortion component based on a feedback signal obtained by feeding back a portion of a radiation signal radiated from an antenna, and that also measures an electric power component based on electric power information extracted from the radiation signal radiated from the antenna;
   a compensation coefficient calculating unit that calculates a compensation coefficient to correct distortion of the signal radiated from the antenna, from the distortion component and the electric power component that are measured by the information measuring unit;
   a signal transmitting unit that outputs a signal corrected using the compensation coefficient calculated by the compensation coefficient calculating unit as a transmission signal;

a signal converting unit that converts the transmission signal transmitted by the signal transmitting unit into a high frequency signal;

an amplitude separating unit that amplifies the high frequency signal converted by the signal converting unit, that outputs the amplified high frequency signal, that picks up a portion from the output high frequency signal, and that separates the portion as a signal to be fed back;

a feeding-back unit that outputs to the information measuring unit as the feedback signal a signal obtained by executing frequency conversion and digital conversion to the high frequency signal separated by the amplitude separating unit to be fed back; and an electric power information extracting unit that outputs the high frequency signal separated by the amplitude separating unit as the radiation signal to the antenna, that extracts the electric power information from the radiation signal, and that directly outputs the electric power information to the information measuring unit without passing the electric power information through the feeding-back unit.

2. The distortion compensating apparatus according to claim 1, wherein the electric power information extracting unit outputs the high frequency signal separated by the amplitude separating unit to the antenna as the radiation signal using an apparatus that measures the voltage standing wave ratio, extracts the electric power information from the radiation signal, and directly outputs the electric power information to the information measuring unit without passing the electric power information through the feeding-back unit.

3. The distortion compensating apparatus according to claim 1, wherein the electric power information extracting unit outputs the high frequency signal separated by the amplitude separating unit to the antenna as the radiation signal using a coupler, extracts the electric power information from the radiation signal, and directly outputs the electric power information to the information measuring unit without passing the electric power information through the feeding-back unit.

4. The distortion compensating apparatus according to claim 1, wherein the feeding-back unit outputs to the information measuring unit as the feedback signal a signal obtained by executing frequency conversion, digital conversion, and temperature compensation to the high frequency signal to be fed back that is separated by the amplitude separating unit.

5. A wireless communicating apparatus comprising:

a distortion compensating apparatus including an information measuring unit that measures a distortion component based on a feedback signal obtained by feeding back a portion of a radiation signal radiated from an antenna, and that also measures an electric power component based on electric power information extracted from the radiation signal radiated from the antenna;

a compensation coefficient calculating unit that calculates a compensation coefficient to correct distortion of the signal radiated from the antenna, from the distortion component and the electric power component that are measured by the information measuring unit;

a signal transmitting unit that outputs a signal corrected using the compensation coefficient calculated by the compensation coefficient calculating unit as a transmission signal;

a signal converting unit that converts the transmission signal transmitted by the signal transmitting unit into a high frequency signal;

an amplitude separating unit that amplifies the high frequency signal converted by the signal converting unit, that outputs the amplified high frequency signal, that picks up a portion from the output high frequency signal, and that separates the portion as a signal to be fed back;

a feeding-back unit that outputs to the information measuring unit as the feedback signal a signal obtained by executing frequency conversion and digital conversion to the high frequency signal separated by the amplitude separating unit to be fed back; and an electric power information extracting unit that outputs the high frequency signal separated by the amplitude separating unit as the radiation signal to the antenna, that extracts the electric power information from the radiation signal, and that directly outputs the electric power information to the information measuring unit without passing the electric power information through the feeding-back unit.

6. The wireless communicating apparatus according to claim 5, wherein the electric power information extracting unit outputs the high frequency signal separated by the amplitude separating unit to the antenna as the radiation signal using an apparatus that measures the voltage standing wave ratio, extracts the electric power information from the radiation signal, and directly outputs the electric power information to the information measuring unit without passing the electric power information through the feeding-back unit.

7. The wireless communicating apparatus according to claim 5, wherein the electric power information extracting unit outputs the high frequency signal separated by the amplitude separating unit to the antenna as the radiation signal using a coupler, extracts the electric power information from the radiation signal, and directly outputs the electric power information to the information measuring unit without passing the electric power information through the feeding-back unit.

8. The wireless communicating apparatus according to claim 5, wherein the feeding-back unit outputs to the information measuring unit as the feedback signal a signal obtained by executing frequency conversion, digital conversion, and temperature compensation to the high frequency signal to be fed back that is separated by the amplitude separating unit.

9. A method of compensating distortion comprising:

measuring, using an information measuring unit, a distortion component based on a feedback signal obtained by feeding back a portion of a radiation signal radiated from an antenna, and also measuring an electric power component based on electric power information extracted from the radiation signal radiated from the antenna;

calculating a compensation coefficient to correct distortion of the signal radiated from the antenna, from the distortion component and the electric power component that are measured in the measuring;

transmitting a signal corrected using the compensation coefficient calculated in the calculating as a transmission signal;

converting the transmission signal transmitted in the transmitting into a high frequency signal;

amplifying the high frequency signal converted in the converting to output the amplified high frequency signal, and picking up a portion from the output high frequency signal to separate the portion as a signal to be fed back;

operating a feeding-back unit that outputs to the information measuring unit as the feedback signal a signal obtained by executing frequency conversion and digital conversion to the high frequency signal to be fed back separated in the amplifying; and outputting the high frequency signal separated in the amplifying as the radiation signal to the antenna, extracting the electric power information from the radiation signal, and directly outputting the electric power information to the information measuring unit without passing the electric power information through the feeding-back unit.

10. The method according to claim 9, wherein
the outputting includes outputting the high frequency signal separated in the amplifying to the antenna as the radiation signal using an apparatus that measures the voltage standing wave ratio, extracting the electric power information from the radiation signal, and directly outputting the electric power information to the information measuring unit without passing the electric power information through the feeding-back unit.

11. The method according to claim 9, wherein
the outputting includes outputting the high frequency signal separated in the amplifying to the antenna as the radiation signal using a coupler, extracting the electric power information from the radiation signal, and directly outputting the electric power information to the information measuring unit without passing the electric power information through the feeding-back unit.

12. The method according to claim 9, wherein
the operating includes outputting to the information measuring unit as the feedback signal a signal obtained by executing frequency conversion, digital conversion, and temperature compensation to the high frequency signal to be fed back that is separated in the amplifying.

* * * * *